United States Patent
Takazane

(10) Patent No.: US 10,516,249 B2
(45) Date of Patent: Dec. 24, 2019

(54) LASER OSCILLATOR

(71) Applicant: FANUC CORPORATION, Yamanashi (JP)

(72) Inventor: Tetsuhisa Takazane, Yamanashi (JP)

(73) Assignee: FANUC CORPORATION, Yamanashi (JP)

(*) Notice: Subject to any disclaimer, the term of this patent is extended or adjusted under 35 U.S.C. 154(b) by 0 days.

(21) Appl. No.: 15/450,052

(22) Filed: Mar. 6, 2017

(65) Prior Publication Data

US 2017/0288368 A1 Oct. 5, 2017

(30) Foreign Application Priority Data

Mar. 29, 2016 (JP) .................................. 2016-066594

(51) Int. Cl.
*H01S 5/022* (2006.01)
*H01S 5/024* (2006.01)
*H01S 5/40* (2006.01)

(52) U.S. Cl.
CPC .......... *H01S 5/02469* (2013.01); *H01S 5/022* (2013.01); *H01S 5/02476* (2013.01); *H01S 5/4025* (2013.01); *H01S 5/0226* (2013.01); *H01S 5/02216* (2013.01); *H01S 5/405* (2013.01)

(58) Field of Classification Search
CPC ............... H01S 5/02469; H01S 5/0226; H01L 2023/4081; H05K 7/2049
See application file for complete search history.

(56) References Cited

U.S. PATENT DOCUMENTS

| | | | |
|---|---|---|---|
| 6,448,583 B1 | 9/2002 | Yoneda et al. | |
| 2005/0238074 A1* | 10/2005 | Matsushita | H01S 5/02244 372/43.01 |
| 2010/0127391 A1* | 5/2010 | Hasegawa | H01L 23/4006 257/719 |
| 2013/0114629 A1 | 5/2013 | Firth et al. | |
| 2013/0222876 A1* | 8/2013 | Sato | H01S 5/4012 359/212.1 |

(Continued)

FOREIGN PATENT DOCUMENTS

| CN | 103293669 A | 9/2013 |
|---|---|---|
| CN | 105210246 A | 12/2015 |

(Continued)

OTHER PUBLICATIONS

An Office Action; "Notice of Reasons for Refusal," issued by the Japanese Patent Office dated Mar. 6, 2018, which corresponds to Japanese Patent Application No. 2016-066594 and is related to U.S. Appl. No. 15/450,052.

(Continued)

*Primary Examiner* — Tod T Van Roy
(74) *Attorney, Agent, or Firm* — Studebaker & Brackett PC

(57) ABSTRACT

To provide a laser oscillator, in which an LD module is fixed to a cooling plate through insulated fixation that is superior in durability, cost, and workability in an insulated fixation operation. A laser oscillator includes an LD module. The LD module has one or a plurality of LD light source(s), and is placed on a thermally conductive insulating member placed on a cooling plate. The LD module of the laser oscillator is fixed to the cooling plate, via an elastic insulating member fixed to the cooling plate.

17 Claims, 3 Drawing Sheets

(56) References Cited

U.S. PATENT DOCUMENTS

| 2016/0099543 A1* | 4/2016 | Kuramoto | H01S 5/022 |
| | | | 372/36 |
| 2017/0092619 A1* | 3/2017 | Refai-Ahmed | H01L 25/0655 |
| 2018/0138657 A1* | 5/2018 | Miura | G02B 6/32 |

FOREIGN PATENT DOCUMENTS

| JP | S50-99873 U | 8/1975 |
| JP | H11-202166 A | 7/1999 |
| JP | 2002-353388 A | 12/2002 |
| JP | 2003-101085 A | 4/2003 |
| JP | 2003-258361 A | 9/2003 |
| JP | 2004-170809 A | 6/2004 |
| JP | 2004-177655 A | 6/2004 |
| JP | 2005-093507 A | 4/2005 |
| JP | 2005-142395 A | 6/2005 |
| JP | 2005-311239 A | 11/2005 |
| JP | 2010-283197 A | 12/2010 |
| JP | 2014-98867 A | 5/2014 |
| WO | 02/099880 A1 | 12/2002 |
| WO | PCT/JP2006/060976 | * 12/2008 |

OTHER PUBLICATIONS

An Office Action mailed by the State Intellectual Property Office of the People's Republic of China dated Jan. 8, 2019, which corresponds to Chinese Patent Application No. 201710160467.6 and is related to U.S. Appl. No. 15/450,052; with English translation.

An Office Action mailed by the German Patent Office dated May 29, 2019, which corresponds to German Patent Application No. 10 2017 104 699.2 and is related to U.S. Appl. No. 15/450,052; with partial English translation.

* cited by examiner

LASER OSCILLATOR

This application is based on and claims the benefit of priority from Japanese Patent Application No. 2016-066594, filed on 29 Mar. 2016, the content of which is incorporated herein by reference.

BACKGROUND OF THE INVENTION

Field of the Invention

The present invention relates to a laser oscillator including an LD module having an LD light source.

Related Art

A laser oscillator for use in cutting or welding a metal or resin material is equipped with an LD module as a light source or an excitation light source. In the case in which an LD power source of the LD module is insulated, it is not necessary to electrically insulate the LD module from the other members; however, in the case in which the LD power source is not insulated, a configuration for fixing the LD module to the other members needs to be electrically insulated (insulated fixation). Further, such a configuration for fixation requires a cooling capability, in which the electrical insulation capability and the cooling capability need to be balanced.

For example, a method for fixing an LD module has been proposed, in which a filler for thermal conduction and insulation are provided between a heat sink and an LD module, and a jig holds down and fixes the LD module from above (e.g., see Patent Document 1). Moreover, for example, a technique for achieving an efficient cooling method has been proposed, in which a member for fixing an LD module is thermally conductive, and a lid portion positioned further above is configured to dissipate heat (e.g., see Patent Document 2). In addition, for example, a structure has been proposed, in which an LD is placed on an insulating substrate (e.g., see Patent Document 3). It is considered that, in general, a method for joining the insulating substrate to the LD employs joining by way of bonding.

Patent Document 1: Japanese Unexamined Patent Application, Publication No. 2010-283197
Patent Document 2: Japanese Unexamined Patent Application, Publication No. 2005-093507
Patent Document 3: Japanese Unexamined Patent Application, Publication No. 2003-101085

SUMMARY OF THE INVENTION

According to the method for fixing the LD module disclosed in Patent Document 1, as described above, the jig holds down and presses the LD module from above; however, this case requires a mechanism for absorbing a height difference between the jig and the LD module due to tolerance of each part. However, Patent Document 1 does not disclose such a mechanism; therefore, when fixation is carried out with the method disclosed in Patent Document 1, a gap may be created between the holding jig and the LD module, or an excessive holding power may act on the LD module and deform the LD module. Further, Patent Document 1 does not disclose a method for electrically insulating the holding jig from the LD module.

Moreover, although the cooling method disclosed in Patent Document 2 can realize an efficient cooling method, electrical insulation cannot be implemented. In addition, with the cooling method disclosed in Patent Document 3, in the case in which an LD module including a plurality of LDs is fixed, die bonding is not suitable, since the LD module is larger than the LD. If the cooling method disclosed in Patent Document 3 is employed for fixing the LD module, workability will be deteriorated.

An object of the present invention is to provide a laser oscillator, in which an LD module is fixed to a cooling plate through insulated fixation that is superior in durability, cost, and workability in an insulated fixation operation.

According to the present invention, a laser oscillator (e.g., an LD module unit 1 to be described later) including an LD module (e.g., an LD module 10 to be described later) having one or a plurality of LD light source(s) is placed on a thermally conductive insulating member (e.g., a thermally conductive insulating member 23 to be described later) placed on a cooling plate (e.g., a cooling plate 21 to be described later), and is fixed to the cooling plate via an elastic insulating member (e.g., an elastic insulating member 25 to be described later) fixed to the cooling plate.

The thermally conductive insulating member may have adhesiveness. Further, the elastic insulating member may have an elastically deformable metal plate (e.g., a metal plate 26B to be described later) and an insulating member (e.g., an insulating member 25B to be described later). The metal plate may be configured with a portion of an LD module storage housing (e.g., a storage housing 27C to be described later).

Moreover, the elastic insulating member (e.g., an insulating member 25D to be described later) may be thermally conductive. In addition, an upper portion of the LD module may have an open configuration. The LD module storage housing (e.g. the storage housing 27C to be described later) may be stacked in an upper direction. Further, the LD module includes a first LD module and a second LD module; and the elastic insulating member (e.g., an insulating member 25E to be described later) of the first LD module may have the second LD module (e.g., an LD module 10E to be described later) and an insulating member (e.g., an insulating member 25E to be described later).

The present invention can provide a laser oscillator, in which an LD module is fixed to a cooling plate through insulated fixation that is superior in durability, cost, and workability in an insulated fixation operation.

DETAILED DESCRIPTION OF THE INVENTION

Figure 1:
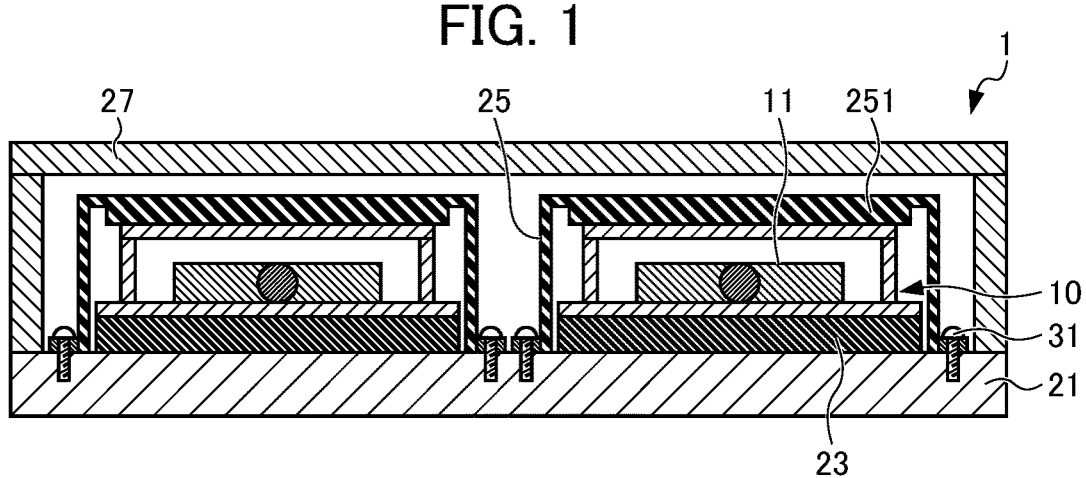
FIG. 1 is a schematic cross-sectional view illustrating an LD module unit 1 composing a laser oscillator according to a first embodiment.

A first embodiment of the present invention is hereinafter described. FIG. 1 is a schematic cross-sectional view illustrating an LD module unit 1 composing a laser oscillator according to the first embodiment.

The LD module unit 1 includes an LD module 10 having one or a plurality of LD light source(s). The LD module 10 has an LD (Laser Diode) 11, and is supplied with electric power from an LD power source (not illustrated), thereby emitting a laser beam. In the case in which the LD module unit 1 is configured with a DDL (Direct Diode Laser), a laser beam is used for direct processing, etc.; and in the case in which the LD module unit 1 is configured with a fiber laser, a laser beam is used as excitation light. In order to maintain the stable beam quality for a long term, it is important to cool the LD module 10; therefore, the LD module 10 is placed on a cooling plate 21.

Specifically, the LD module 10 is placed on a thermally conductive insulating member 23. The thermally conductive insulating member 23 is placed on the cooling plate 21. For the thermally conductive insulating member 23, a rubber material such as Viton or perfluoroelastomer with enhanced thermal conductivity through added filler, or ceramic is used.

The LD module 10 is fixed to the cooling plate 21 via an elastic insulating member 25 fixed to the cooling plate 21. The elastic insulating member 25 abuts on an upper portion of a module body 13 of the LD module 10 from above the LD module 10, so as to cover the LD module 10. A portion 251 of the elastic insulating member 25 abuts on the upper portion of the module body 13, and is thicker than the other portions of the elastic insulating member 25, such that an appropriate pressing force can press the LD module 10 against the thermally conductive insulating member 23 and the cooling plate 21.

Further, the LD module 10 is pressed downwards by way of the elastic insulating member 25. In terms of fixing the elastic insulating member 25 to the cooling plate 21, it is not necessary to insulate between the elastic insulating member 25 and the cooling plate 21; therefore, an insulating resin screw or the like is not necessary and not used for fixing the lower portion of the elastic insulating member 25 to the cooling plate 21. The lower portion of the elastic insulating member 25 is fixed to the cooling plate 21 by way of steel screws 31. Fixation of the elastic insulating member 25 to the cooling plate 21 is not limited to fixation by way of the steel screws 31; and for example, the elastic insulating member 25 may be engaged with the cooling plate 21, such that a hook-like protrusion is provided to the cooling plate 21 in advance, and is passed through a hole provided to the elastic insulating member 25 in advance.

A rubber material such as, for example, Viton or perfluoroelastomer is used for the elastic insulating member 25. The elastic insulating member 25 has elasticity, thereby absorbing dimensional tolerance of the LD module 10 and the cooling plate 21; and an appropriate force fixes the LD module 10 by virtue of the elasticity of the elastic insulating member 25. The LD module 10, the thermally conductive insulating member 23, the elastic insulating member 25, and the steel screws 31 are covered with and stored in a storage housing 27.

As described above, according to the present embodiment, the LD module unit 1 including the LD module 10 having one or a plurality of LD light source(s) is placed on the thermally conductive insulating member 23 placed on the cooling plate 21, and is fixed to the cooling plate 21 via the elastic insulating member 25 fixed to the cooling plate 21.

Thus, in order to fix the LD module 10, the use of an insulating screw made of engineering plastic such as PPS (polyphenylene sulfide) or PTFE (polytetrafluoroethylene) for ensuring insulation is eliminated; the elastic insulating member 25 is fixed to the cooling plate 21 by use of metal screws such as the steel screws 31 to ensure insulation; and the LD module 10 can be fixed to the cooling plate 21 while ensuring insulation. Further, since the elastic insulating member 25 has elasticity, the LD module 10 does not need to be exactly positioned. Thus, the LD module unit 1 can be provided, in which the LD module 10 is fixed to the cooling plate 21 through insulated fixation that is superior in durability, cost, and workability in an insulated fixation operation.

Figure 2:
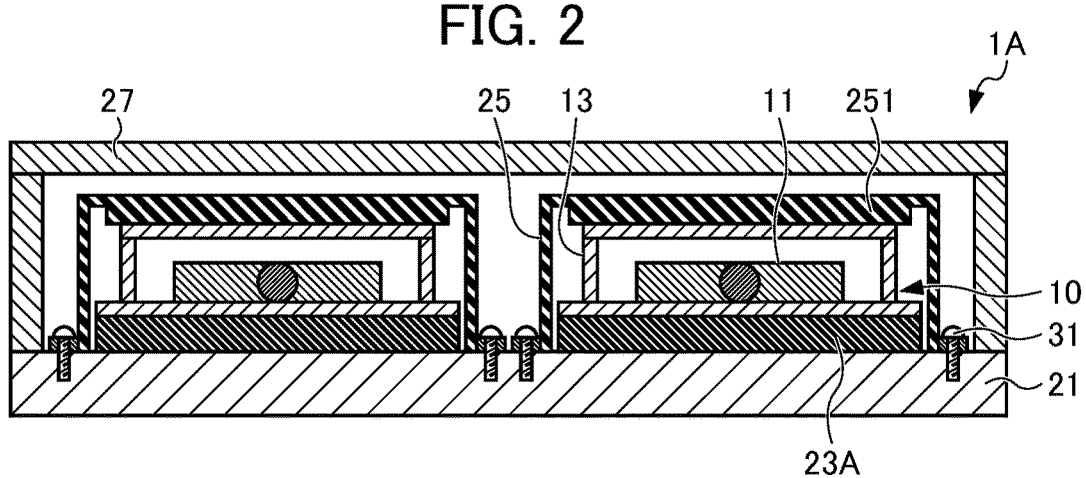
FIG. 2 is a schematic cross-sectional view illustrating an LD module unit 1A composing a laser oscillator according to a second embodiment.

Next, a laser oscillator according to a second embodiment of the present invention is described with reference to FIG. 2. FIG. 2 is a schematic cross-sectional view illustrating an LD module unit 1A composing the laser oscillator according to the second embodiment.

In the LD module unit 1A according to the second embodiment, a thermally conductive insulating member 23A differs from the thermally conductive insulating member 23 according to the first embodiment. Since other configurations are similar to those of the LD module unit 1 according to the first embodiment, the configurations similar to those of the first embodiment are assigned with similar reference numerals, respectively, and descriptions thereof are omitted herein.

The thermally conductive insulating member 23A of the LD module unit 1A is configured with an adhesive material. A rubber-based adhesive, an acrylic adhesive, a silicone-based adhesive or the like is used as the adhesive material; and a silicone-based adhesive, which is superior in thermal resistance and weather resistance, is used in the present embodiment. Thus, the LD module 10 is placed on the thermally conductive insulating member 23A, and is adhesively fixed to the thermally conductive insulating member 23A. The thermally conductive insulating member 23A is placed on the cooling plate 21, and is adhesively fixed to the cooling plate 21.

As described above, according to the present embodiment, the thermally conductive insulating member 23A has adhesiveness. Thus, when the LD module 10 is placed on the thermally conductive insulating member 23A, positional deviation of the LD module 10 in relation to the thermally conductive insulating member 23A can be prevented; positional deviation of the thermally conductive insulating member 23A in relation to the cooling plate 21 can be prevented; the LD module 10 can be easily positioned in relation to the thermally conductive insulating member 23A; and the thermally conductive insulating member 23A can be easily positioned in relation to the cooling plate 21; therefore, the LD module unit 1A can be easily assembled.

Next, a laser oscillator according to a third embodiment of the present invention is described with reference to FIG. 3.

Figure 3:
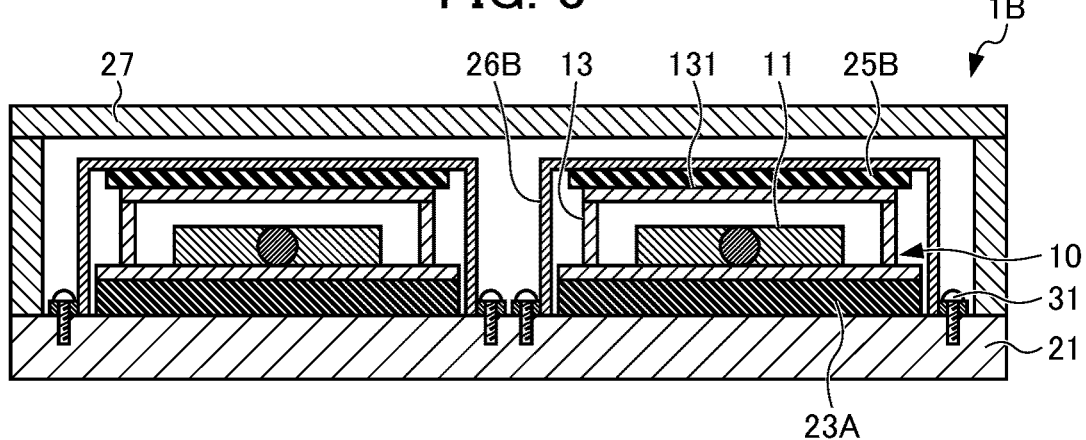
FIG. 3 is a schematic cross-sectional view illustrating an LD module unit 1B composing a laser oscillator according to a third embodiment.

FIG. 3 is a schematic cross-sectional view illustrating an LD module unit 1B composing the laser oscillator according to the third embodiment.

In the LD module unit 1B according to the third embodiment, the elastic insulating member is configured with an insulating member 25B and a metal plate 26B having a spring property, which is a difference from the second embodiment. Since other configurations are similar to those of the LD module unit 1A according to the second embodiment, the configurations similar to those of the second embodiment are assigned with similar reference numerals, respectively, and descriptions thereof are omitted herein.

The insulating member 25B is placed on an upper portion of the module body 13 of the LD module 10, and abuts on an upper plate 131 of the module body 13 from above the LD module 10. As illustrated in FIG. 3, the metal plate 26B abuts on the insulating member 25B from above the insulating member 25B, so as to cover the LD module 10 and the insulating member 25B placed on the top plate 131 of the module body 13. A lower portion of the metal plate 26B is fixed to the cooling plate 21 by way of the steel screws 31. Namely, by virtue of the elasticity of the metal plate 26B, the LD module 10 is pressed downwards via the insulating member 25B, thereby fixing the LD module 10 to the cooling plate 21 via the thermally conductive insulating member 23A. For example, spring steel or the like is used for the metal plate 26B. Further, the metal plate may be configured to have a multistage crease. Thus, the spring property of the metal plate can be enhanced.

As described above, according to the present embodiment, the elastic insulating member has the elastically deformable metal plate 26B and the insulating member 25B. Thus, by holding down and fixing the LD module 10 by way of the metal plate 26B having a spring property arising from elastic deformation, the LD module 10 can be reliably fixed to the cooling plate 21, while the force applied to the LD module 10 is dispersed by the holding down.

Figure 4:
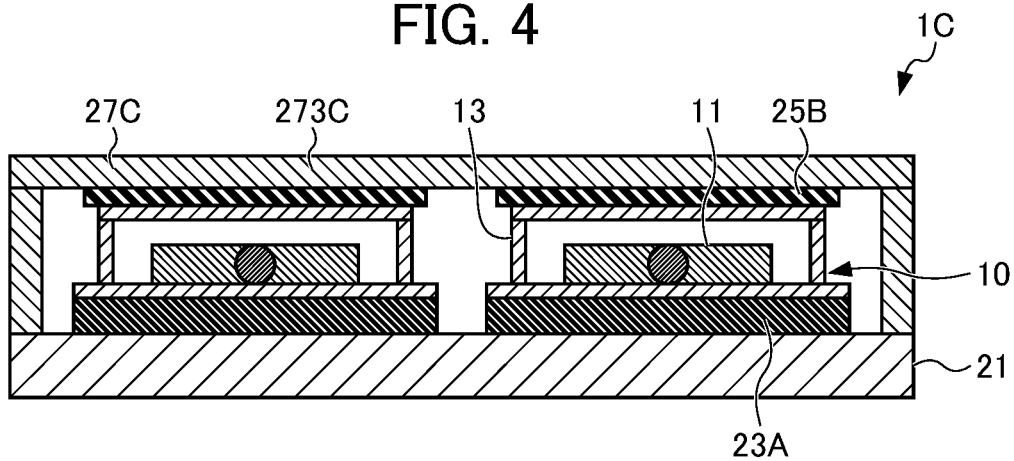
FIG. 4 is a schematic cross-sectional view illustrating an LD module unit 10 composing a laser oscillator according to a fourth embodiment.

Next, a laser oscillator according to a fourth embodiment of the present invention is described with reference to FIG. 4. FIG. 4 is a schematic cross-sectional view illustrating an LD module unit 1C composing the laser oscillator according to the fourth embodiment.

In the LD module unit 1C according to the fourth embodiment, the metal plate is configured with a portion of a storage housing 27C for storing the LD module 10, which is a difference from the third embodiment. Since other configurations are similar to those of the LD module unit 1B according to the third embodiment, the configurations similar to those of the third embodiment are assigned with similar reference numerals, respectively, and descriptions thereof are omitted herein.

In the LD module unit 1C, the metal plate is configured with a portion of the storage housing 27C having a spring property. Further, the vertical height of the storage housing 27C is configured to be lower than the vertical height of the storage housing 27 in the first to third embodiments. A top surface of the insulating member 25B abuts on an under surface of a top plate 273C of the storage housing 27C. Therefore, the LD module 10 is fixed to the cooling plate 21 via the storage housing 27C.

As described above, according to the present embodiment, the metal plate is configured with a portion of the storage housing 27C for storing the LD module 10. Thus, the storage housing 27C also serves as a metal plate; it is not necessary to provide a metal plate separately from the storage housing 27C; and the number of parts of the configuration for fixing the LD module 10 to the cooling plate 21 can be reduced in the LD module unit 1C.

Figure 5:
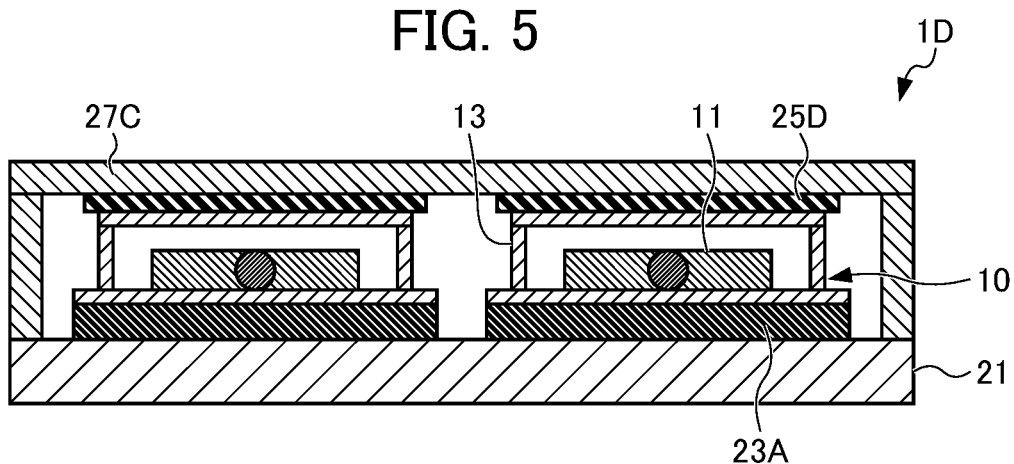
FIG. 5 is a schematic cross-sectional view illustrating an LD module unit 1D composing a laser oscillator according to a fifth embodiment.

Next, a laser oscillator according to a fifth embodiment of the present invention is described with reference to FIG. 5. FIG. 5 is a schematic cross-sectional view illustrating an LD module unit 1D composing the laser oscillator according to the fifth embodiment.

In the LD module unit 1D according to the fifth embodiment, an insulating member 25D composing the elastic insulating member is thermally conductive, which is a difference from the fourth embodiment. Since other configurations are similar to those of the LD module unit 1C according to the fourth embodiment, the configurations similar to those of the fourth embodiment are assigned with similar reference numerals, respectively, and descriptions thereof are omitted herein.

The insulating member 25D is thermally conductive, and is configured to be capable of radiating heat from the LD module 10 via the insulating member 25D. Thus, this configuration can transfer the heat of the LD module 10 to the storage housing 27C via the insulating member 25D, and can enhance the cooling of the LD module 10.

Figure 6:
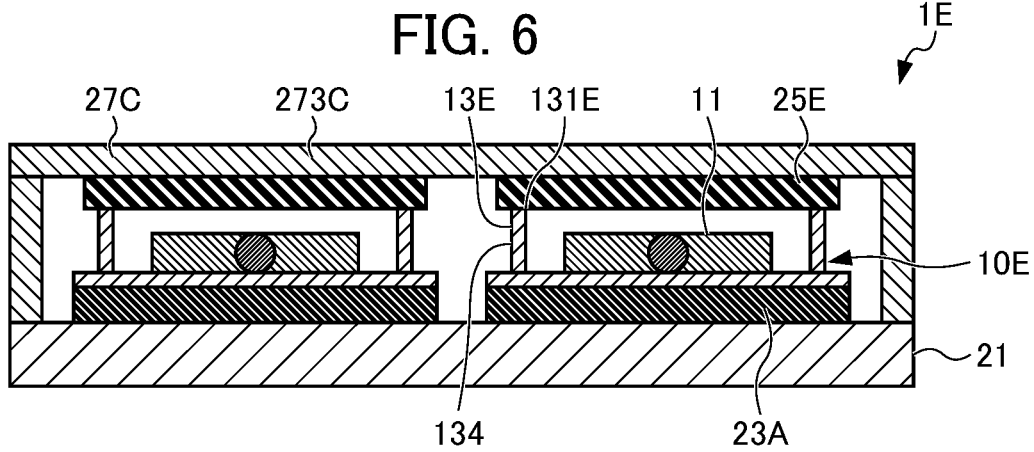
FIG. 6 is a schematic cross-sectional view illustrating an LD module unit 1E composing a laser oscillator according to a sixth embodiment.

Next, a laser oscillator according to a sixth embodiment of the present invention is described with reference to FIG. 6. FIG. 6 is a schematic cross-sectional view illustrating an LD module unit 1E composing the laser oscillator according to the sixth embodiment.

In the LD module unit 1E according to the sixth embodiment, an upper portion of the module body 13E of the LD module 10E has an open configuration, which is a difference from the fifth embodiment. Since other configurations are similar to those of the LD module unit 1D according to the fifth embodiment, the configurations similar to those of the fifth embodiment are assigned with similar reference numerals, respectively, and descriptions thereof are omitted herein.

As illustrated in FIG. 6, an upper portion of the module body 13E of the LD module 10E has an open configuration, in which an aperture 131E is formed. The insulating member 25E composing the elastic insulating member is configured to be thicker than the insulating member 25B of the fifth embodiment, and is thermally conductive. An under surface of the insulating member 25E seals the aperture 131E in the upper portion of the module body 13E; and a top surface of the insulating member 25E abuts on an under surface of the top plate 273C of the storage housing 27C. Therefore, the module body 13E is fixed to the cooling plate 21 via the storage housing 27C.

As described above, according to the present embodiment, since the upper portion of the module body 13E of the LD module 10E has an open configuration, the module body 13E of the LD module 10E no longer requires the top plate 131 (see FIG. 3); and the step of providing the top plate 131 to the module body 13E of the LD module 10E can be eliminated. Further, the number of parts composing the module body 13E can be reduced; and the step of sealing between the top plate 131 and the side wall 134 can be omitted. Further, since the aperture 131E is sealed by way of the insulating member 25E, the module body 13E having the aperture 131E in the LD module 10E can be configured to be hermetically sealed by way of the insulating member 25E.

Figure 7:
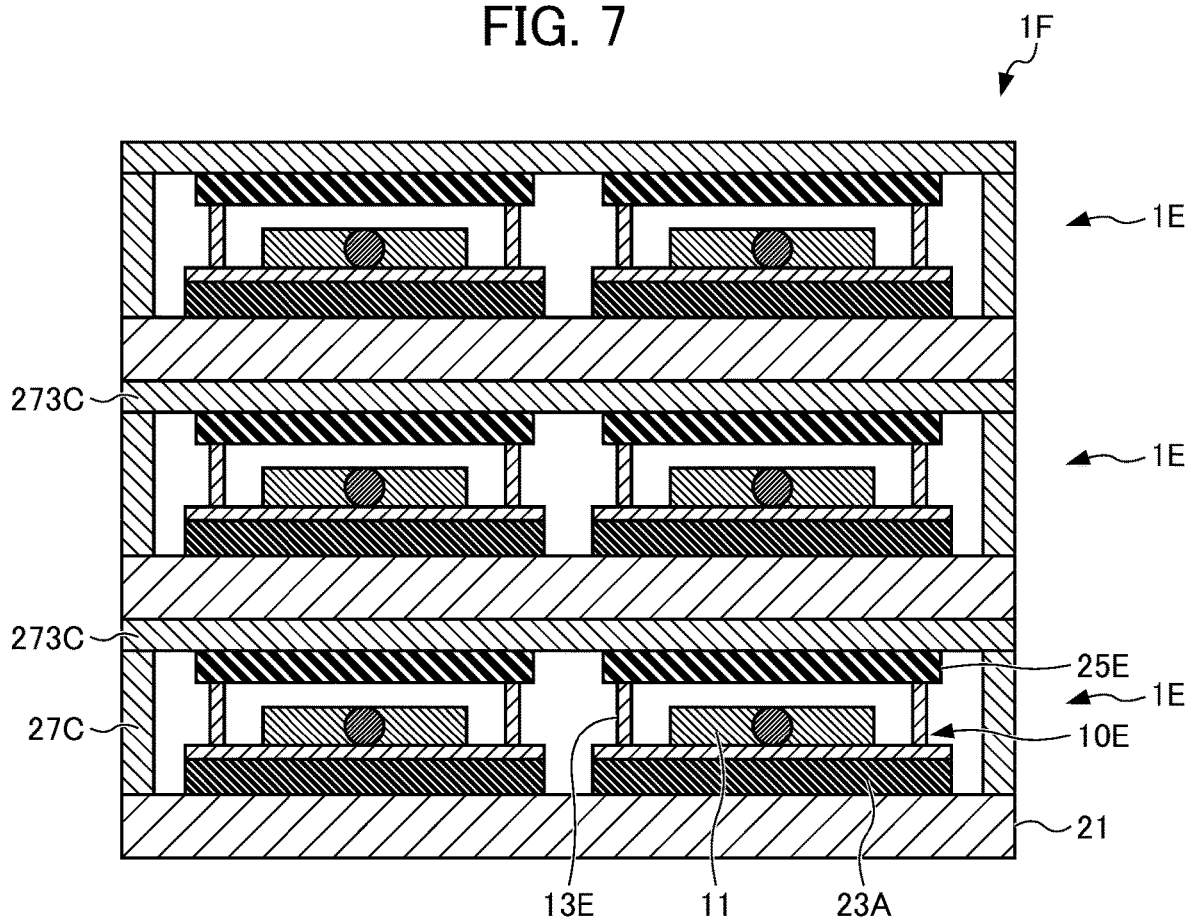
FIG. 7 is a schematic cross-sectional view illustrating an LD module unit 1F composing a laser oscillator according to a seventh embodiment.

Next, a laser oscillator according to a seventh embodiment of the present invention is described with reference to FIG. 7. FIG. 7 is a schematic cross-sectional view illustrating an LD module unit 1F composing the laser oscillator according to the seventh embodiment.

In the LD module unit 1F according to the seventh embodiment, the storage housing 27C for storing the LD module 10E is stacked in an upper direction, which is a difference from the sixth embodiment. Since other configurations are similar to those of the LD module unit 1E according to the sixth embodiment, the configurations similar to those of the sixth embodiment are assigned with similar reference numerals, respectively, and descriptions thereof are omitted herein.

As illustrated in FIG. 7, the LD module unit 1F is configured such that three LD module units 1E having a plurality of LD modules 10E covered with the storage housing 27C and fixed to the cooling plate 21 are stacked in the vertical direction. The under surface of the cooling plate 21 of the LD module unit 1E at the middle level is placed on the top surface of the top plate 273C of the storage housing 27C of the LD module unit 1E at the bottom level. The under surface of the cooling plate 21 of the LD module unit 1E at the top level is placed on the top surface of the top plate 273C of the storage housing 27C of the LD module unit 1E at the middle level.

As described above, according to the present embodiment, the storage housings 27C for storing the LD modules 10E are stacked in an upper direction. Therefore, since an effect of cooling the top plate 273C of the storage housing 27C can be obtained from the cooling plate 21 placed on the top surface of the top plate 273C of the storage housing 27C, allowing for further increasing the cooling efficiency, and enhancing the cooling of the LD module 10E.

Figure 8:
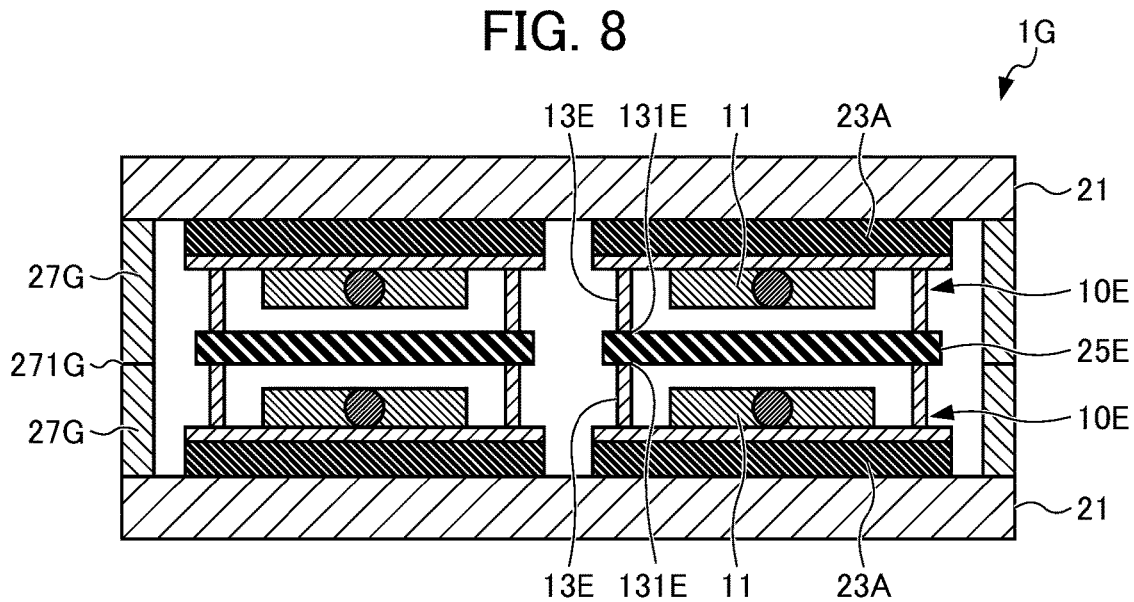
FIG. 8 is a schematic cross-sectional view illustrating an LD module unit 1G composing a laser oscillator according to an eighth embodiment.

Next, a laser oscillator according to an eighth embodiment of the present invention is described with reference to FIG. 8. FIG. 8 is a schematic cross-sectional view illustrating an LD module unit 1G composing the laser oscillator according to the eighth embodiment.

In the LD module unit 1G according to the eighth embodiment, the LD module 1G includes a first LD module 10E and a second LD module 10E; and the elastic insulating member of the first LD module 10E (the lower LD module 10E in FIG. 8) has the second LD module 10E (the upper LD module 10E in FIG. 8) and the insulating member 25E, which is a difference from the seventh embodiment. Further, in the LD module unit 1G according to the eighth embodiment, the second LD module 10E is reversed upside down in relation to the first LD module 10E, and is stacked on the first LD module 10E via the insulating member 25E, which is a difference from the seventh embodiment. Since other configurations are similar to those of the LD module unit 1 according to the seventh embodiment, the configurations similar to those of the seventh embodiment are assigned with similar reference numerals, respectively, and descriptions thereof are omitted herein.

As illustrated in FIG. 8, a storage housing 27G of the LD module unit 1G does not have a top plate 273C (see FIG. 7). The upper end of one storage housing 27G (the lower storage housing 27G in FIG. 8) has an aperture 271G and is open. The aperture 271G of the upper end (which is the lower end reversed upside down in FIG. 8) of another storage housing 27G (the upper storage housing 27G in FIG. 8) abuts on and is connected to the aperture 271G of the upper end of the one storage housing 27G. In addition, the second LD module 10E is reversed upside down and connected to the top surface of the insulating member 25E, such that the top surface of the insulating member 25E that seals the aperture 131E of the module body 13E of the first LD module 10E seals the aperture 131E of the module body 13E of the second LD module 10E. Namely, the elastic insulating member of the first LD module 10E is configured with the second LD module 10E and the insulating member 25E. Moreover, the first LD module 10E is pressed against and is fixed to the lower thermally conductive insulating member 23A and the lower cooling plate 21 in FIG. 8, by virtue of the insulating member 25E, the second LD module 10E, the upper thermally conductive insulating member 23A and the upper cooling plate 21 in FIG. 8, and the upper and lower storage housings 27G in FIG. 8.

As described above, according to the present embodiment, the LD module includes a first LD module and a second LD module; and the elastic insulating member of the first LD module 10E has the second LD module 10E and the insulating member 25E. Therefore, the top plate 273C (see FIG. 7) becomes unnecessary in the storage housing 27G, and the LD modules 10E mutually press against each other in this structure; therefore, the configuration for fixing the LD module 10E to the cooling plate 21 can be configured with a smaller number of parts. Further, since the cooling plates 21 are placed above and below the LD modules 10E, the LD modules 10E are cooled from above and below, and the gas in a vicinity of the LD modules 10E is more likely to circulate; therefore, the cooling is enhanced.

The embodiments of the present invention have been described above; however, the present invention is not limited to the above-described embodiments. Moreover, the effects described in the present embodiments are merely enumeration of preferable effects arising from the present invention; and the effects according to the present invention are not limited to those described in the present embodiments.

For example, the configuration of the laser oscillator, more specifically, the configuration for fixing the LD module to the cooling plate is not limited to the configuration of each portion in the above-described embodiments.

For example, in the LD module unit 1G according to the eighth embodiment, the insulating member 25E as the elastic insulating member is thermally conductive; however, the present invention is not limited to this configuration.

EXPLANATION OF REFERENCE NUMERALS 1, 1A, 1B, 1C, 1D, 1E, 1F, 1G: LD module unit (laser oscillator)
10, 10E: LD module
21: cooling plate
23, 23A: thermally conductive insulating member
25: elastic insulating member
25B, 25D, 25E: insulating member
26B: metal plate
27C, 27G: storage housing

What is claimed is:
1. A laser oscillator comprising a laser diode (LD) module having one or a plurality of LD light source(s), wherein the LD module is placed on a thermally conductive insulating member, the thermally conductive insulating member is directly placed on a surface of a cooling plate at a location directly between the LD module and the surface of the cooling plate such that the LD module is positioned a spaced distance from the cooling plate by the thermally conductive insulating member, and the LD module and thermally conductive insulating member are fixed to the cooling plate via a single u-shaped elastic insulating member piece which extends from a side of the LD module that is opposite from the cooling plate to a same side of the LD module placed on the thermally conductive insulating member and the single u-shaped elastic insulating member is directly fixed to and in direct contact with the same surface of the cooling plate on which the thermally conductive insulating member is placed.

2. The laser oscillator according to claim 1, wherein the thermally conductive insulating member has adhesiveness.

3. The laser oscillator according to claim 2, wherein the elastic insulating member abuts an upper portion of the LD module.

4. The laser oscillator according to claim 3, including an LD module storage housing, and the LD module storage housing covers the one or plurality of LD light sources, the thermally conductive insulating member, and the elastic insulating member.

5. The laser oscillator according to claim 4, wherein the LD module storage housing is positioned a spaced distance from the elastic insulating member.

6. The laser oscillator according to claim 3, wherein a thickness of the elastic insulating member where the elastic insulating member abuts the upper portion of the LD module includes a thickness that is greater than a thickness of other portions of the elastic insulating member.

7. The laser oscillator according to claim 1, wherein the LD module is positioned directly between the elastic insulating member and the cooling plate, and an elasticity of the elastic insulating member adjusts a position a furthest most location of the elastic insulating member from the cooling plate to be equal to a furthest most location of the LD module from the cooling plate plus a thickness of the elastic insulating member.

8. A laser oscillator comprising:
a cooling plate;
a thermally conductive insulating member positioned on the cooling plate;
an elastic member directly fixed to a surface of the cooling plate and in contact with the surface of the cooling plate, the elastic member including a plurality of sides; and
an LD module positioned directly on the thermally conductive insulating member in a location directly between the elastic member and the cooling plate such that the LD module is positioned a spaced distance from the surface of the cooling plate by the thermally conductive insulating member, the LD module fixed to the cooling plate by the fixing of the elastic member to the cooling plate, the elastic member in contact with the LD module at a location, a maximum distance of the elastic member from the cooling plate is at the contact location of the elastic member with the LD module, the maximum distance adjusted by an elasticity of the elastic member to be a same distance at the contact location of the elastic member with the LD module plus a thickness of the elastic member at the contact location, and the sides of the elastic member extend toward the cooling plate a spaced distance from the contact location.

9. The laser oscillator according to claim 8, wherein the elastic member is fixed to the cooling plate by a plurality of fasteners.

10. The laser oscillator according to claim 8, wherein the spaced distance is determined at least in part by a thickness of the LD module.

11. The laser oscillator according to claim 8, wherein the spaced distance is determined by a thickness of the thermally conductive insulating member and a thickness of the LD module.

12. The laser oscillator according to claim 8, wherein the thickness of the elastic member at the contact location is greater than the thickness of at least one side of the plurality of sides of the elastic member.

13. A laser oscillator comprising:
a cooling plate having a side;
an LD module having an LD module surface that faces toward and opposes the cooling plate side;
a thermally conductive insulating member positioned directly on the side of the cooling plate at a location directly between the LD module surface and the cooling plate side;
an elastic member that appears u-shaped in a cross-section side view, the elastic member including a plurality of elastic sides; and
the LD module positioned on the thermally conductive insulating member in a location directly between the elastic member and the cooling plate, each of the plurality of elastic sides positioned to extend alongside the LD module toward the cooling plate, and each of the plurality of elastic sides in direct contact with and fixed to the side of the cooling plate.

14. The laser oscillator of claim 13, wherein each of the plurality of elastic sides is fixed to the cooling plate by at least one fastener.

15. The laser oscillator of claim 13, wherein fixing the plurality of elastic sides to the cooling plate exerts a force on the LD module in a direction of the cooling plate.

16. The laser oscillator of claim 13, wherein the elastic member is formed of a rubber material.

17. The laser oscillator of claim 16, wherein the rubber material is one of a perfluoroelastomer or Viton.

* * * * *